(12) United States Patent
Hidaka (10) Patent No.: US 8,054,874 B2
(45) Date of Patent: Nov. 8, 2011

(54) METHOD AND SYSTEM FOR PROVIDING FAST AND ACCURATE ADAPTIVE CONTROL METHODS

(75) Inventor: Yasuo Hidaka, Cupertino, CA (US)

(73) Assignee: Fujitsu Limited, Kawasaki (JP)

( * ) Notice: Subject to any disclaimer, the term of this patent is extended or adjusted under 35 U.S.C. 154(b) by 1076 days.

(21) Appl. No.: 11/862,799

(22) Filed: Sep. 27, 2007

(65) Prior Publication Data

US 2009/0086989 A1 Apr. 2, 2009

(51) Int. Cl.
 *H03H 7/40* (2006.01)
 *H03H 7/30* (2006.01)
 *H03K 5/159* (2006.01)
(52) U.S. Cl. ........ 375/232; 375/229; 375/230; 375/233; 375/346; 375/350
(58) Field of Classification Search .......... 375/229–236, 375/346–350
See application file for complete search history.

(56) References Cited

U.S. PATENT DOCUMENTS

5,568,411 A * 10/1996 Batruni .......................... 708/322
2007/0055505 A1* 3/2007 Doclo et al. .................. 704/226
* cited by examiner

*Primary Examiner* — Curtis Odom
(74) *Attorney, Agent, or Firm* — Baker Botts L.L.P.

(57) ABSTRACT

In accordance with a particular embodiment of the present invention, a method is offered that includes providing a low-pass filter in an adaptive filter architecture employing a fast steepest descent method. The method further includes decomposing an error signal, injecting a small change to one or more weight parameters for a linear combiner, measuring changes in an error correlation vector, and calculating one or more gradients, wherein the gradients are processed by the low-pass filter. In more particular embodiments, one or more of the gradients are processed by the low-pass-filter in order to remove measurement noise and improve accuracy. In addition, a real gradient of the error correlation vector is monitored such that adaptations can be made due to non-linearity and non-constant characteristics of a channel. The low-pass filter may be replaced with a Kalman Filter for faster convergence.

16 Claims, 6 Drawing Sheets

METHOD AND SYSTEM FOR PROVIDING FAST AND ACCURATE ADAPTIVE CONTROL METHODS

RELATED APPLICATIONS

This application is related to U.S. patent application Ser. No. 11/862,823, filed Sep. 27, 2007, now U.S. Pat. No. 7,848, 471, and U.S. patent application Ser. No. 11/862,838, filed Sep. 27, 2007, now U.S. Pat. No. 7,848,401, both filed concurrently with the present application.

TECHNICAL FIELD OF THE INVENTION

This invention relates generally to the field of data communications and, more specifically, to a system for providing fast and accurate adaptive control methods.

BACKGROUND OF THE INVENTION

In mathematics, the term optimization refers to the study of problems in which one seeks to minimize or maximize a real function by systematically choosing the values of real or integer variables from within an allowed set. A resulting formulation is called an optimization problem or a mathematical programming problem. Many real world and theoretical problems may be modeled in this general framework. Problems formulated using this technique in the fields of physics and computers may refer to the technique as energy minimization.

The branch of applied mathematics and numerical analysis that is concerned with the development of deterministic algorithms that are capable of guaranteeing convergence in finite time to the actual optimal solution of a non-convex problem is generally labeled optimization.

In particular, the steepest descent method is a generic optimization algorithm that optimizes the system input step by step using the gradient of the cost function. As with all such optimizations, of critical importance are issues relating to speed, accuracy, and automation.

SUMMARY OF THE INVENTION

The present invention provides a method and a system for providing accurate, adaptive control that substantially eliminates or reduces at least some of the disadvantages and problems associated with previous optimization methods and systems.

In accordance with a particular embodiment of the present invention, a method is offered that includes providing a low-pass filter in an adaptive filter architecture employing a fast steepest descent method. The method further includes decomposing an error signal, injecting a small change to one or more weight parameters for a linear combiner, measuring changes in an error correlation vector, and calculating one or more gradients, wherein the gradients are processed by the low-pass filter.

In more particular embodiments, one or more of the gradients are processed by the low-pass-filter in order to remove measurement noise and improve accuracy. In addition, a real gradient of the error correlation vector is monitored such that adaptations can be made due to non-linearity and non-constant characteristics of a channel. The low-pass filter may be replaced with a Kalman Filter for faster convergence. The error correlation vector is multiplied with the gradient matrix and loop constant, and then, integrated to generate a plurality of weight parameters for a linear combiner. In still other embodiments, the adaptive filter includes an offset vector and a decoupling matrix, which are optional.

Technical advantages of particular embodiments of the present invention include the use of a fast steepest descent method, which offers improved accuracy and speed. In addition, such an architecture is easy to adjust the steady state to the real best state and, further, easy to decouple interactions between multiple control loops.

In regards to the least-mean-square algorithm, there is no need to observe the inputs of the linear combiner and, further, the system takes into account some non-linearity of the system. In addition, the configuration of the present invention is easy to adjust the steady state to the real best state, while being easy to decouple interactions between multiple control loops.

Also, in the context of a general zero-forcing (ZF) algorithm, the system is always the same steady state as the steepest descent method. Moreover, such a framework of the present invention takes into account some non-linearity of the system. In addition, this system keeps tracks of the change in the channel and filter characteristics. In such an arrangement, there is no need to use the impulse response of the worst-case channel with filter banks. Turning to the damped Gauss-Newton method, such an implementation is more accurate after convergence, which is advantageous.

Other technical advantages will be readily apparent to one skilled in the art from the following figures, descriptions, and claims. Moreover, while specific advantages have been enumerated above, various embodiments may include all, some or none of the enumerated advantages.

BRIEF DESCRIPTION OF THE DRAWINGS

For a more complete understanding of particular embodiments of the invention and their advantages, reference is now made to the following descriptions, taken in conjunction with the accompanying drawings, in which.

DETAILED DESCRIPTION OF THE INVENTION

Figure 1:
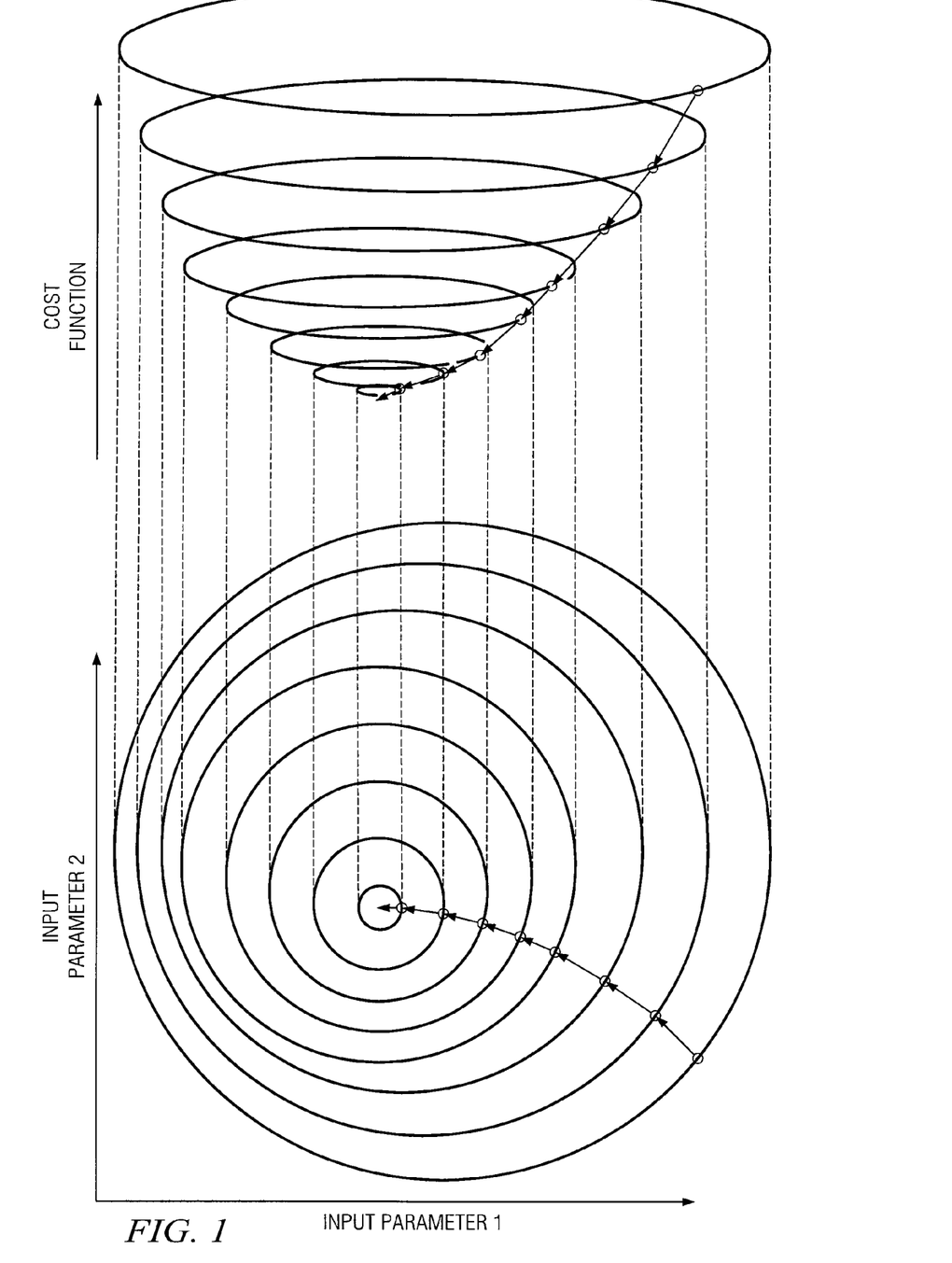
FIG. 1 is a simplified diagram illustrating a steepest descent method relating to one embodiment of the present invention.

FIG. 1 is a simplified diagram illustrating a steepest descent method relating to one embodiment of the present invention, which offers adaptive control methods that are fast, simple, and accurate. As a general proposition, the steepest descent method is a generic optimization algorithm, which optimizes the system input step by step using the gradient of the cost function. The relationship between input parameters #1 and #2 and the cost function is illustrated by FIG. 1.

The steepest descent method can be defined by Equation 1:

$$w_i^{(c+1)} = w_i^{(c)} + \left[-\mu \frac{\partial E[\{e(k)\}^2]}{\partial w_i}\right]_{w=w^{(c)}} \quad \text{EQ 1}$$

A problem with the steepest descent method is efficiency and accuracy because it takes a long time to measure a gradient accurately. Furthermore, the measurement must be repeated for each step in the process.

Figure 2:
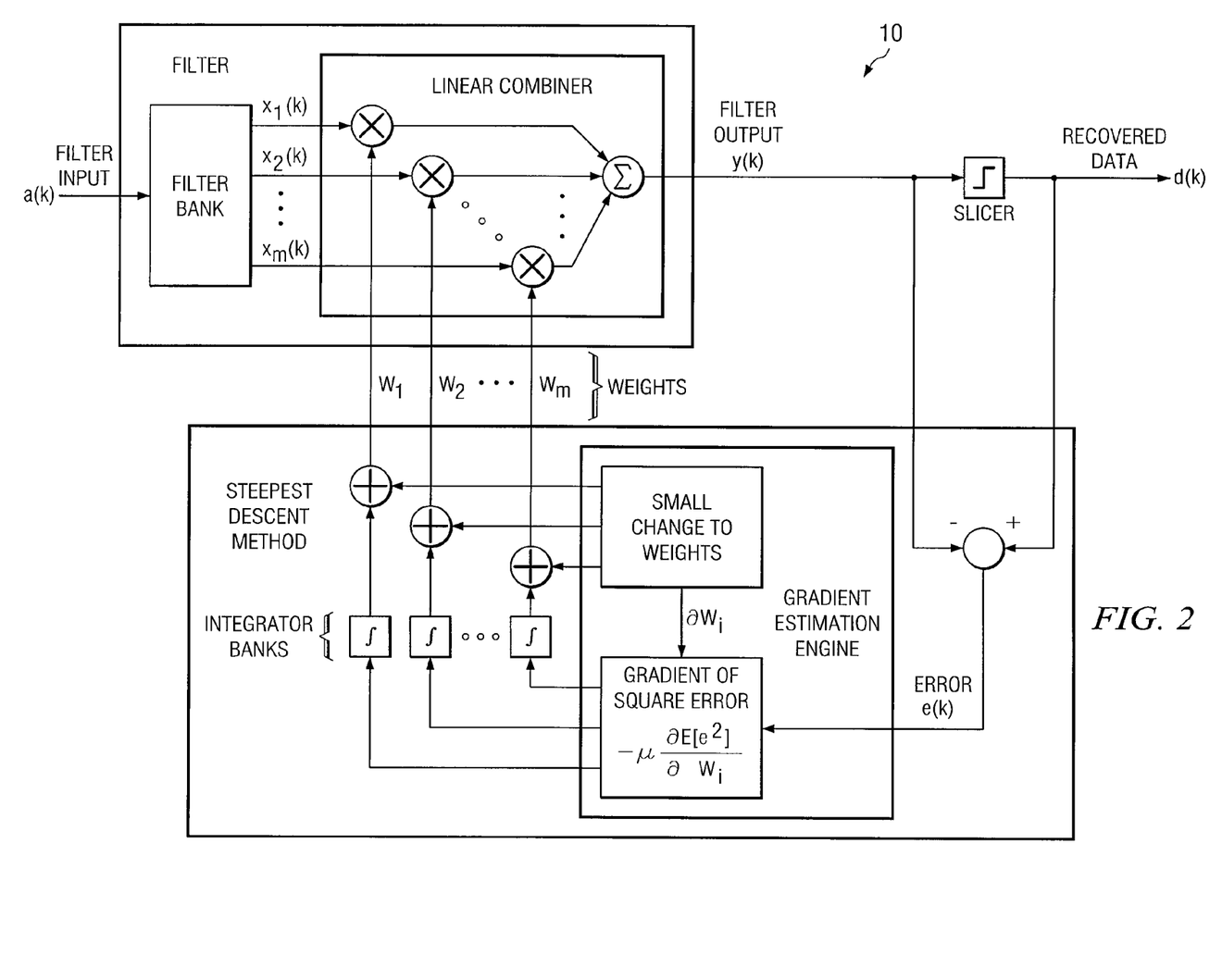
FIG. 2 is a simplified block diagram illustrating an adaptive filter using the steepest descent method.

FIG. 2 is a simplified block diagram illustrating an adaptive filter 10 using the steepest descent method. Adaptive filter 10 includes a filter bank, a linear combiner, a filter output, a slicer, and recovered data that is fed into the steepest descent method. The steepest descent method includes integrator banks and a gradient estimation engine that includes small changes to weights and a gradient of the square error component.

Figures 3, 7:
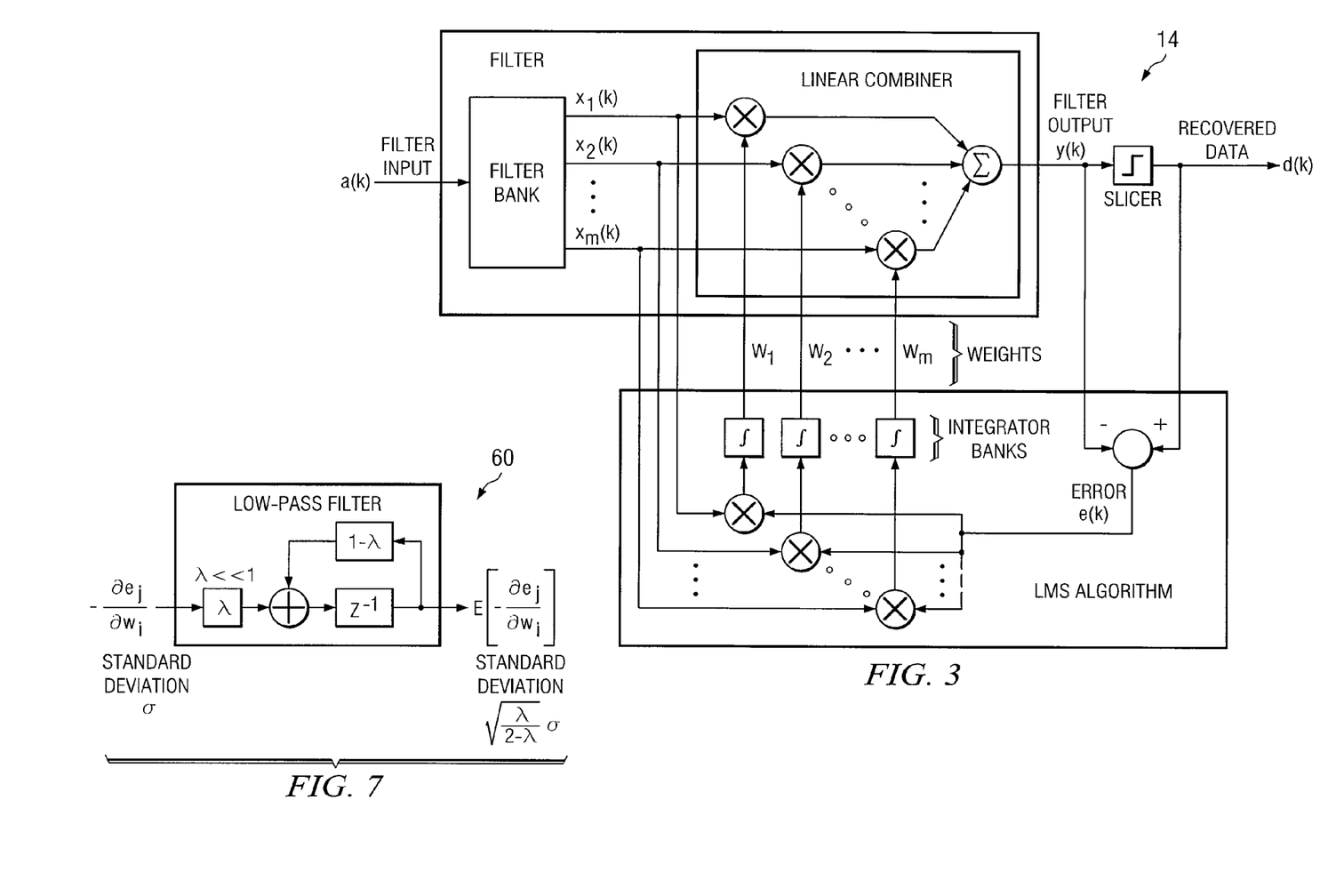
FIG. 3 is a simplified block diagram illustrating an adaptive filter using a Least-Mean-Square (LMS) algorithm.
FIG. 7 is a simplified block diagram illustrating an example of a first-order low-pass filter in accordance with an embodiment of the present invention.

FIG. 3 is a simplified block diagram illustrating an adaptive filter 14 using a Least-Mean-Square (LMS) algorithm. The Least-Mean-Square (LMS) algorithm, which is also called stochastic steepest descent method, provides one solution for the problem of the steepest descent method. The LMS algorithm uses the inputs of the linear combiner instead of measuring the gradient because the inputs of the linear combiner are statistically equivalent to the gradient of errors, when the data sequence is uncorrelated random data. Hence, the steady state of the LMS algorithm is same as the steepest descent method.

The Least-Mean-Square (LMS) algorithm can be defined as:

$$e(k) = d(k) - y(k) \quad \text{EQ 2}$$
$$= d(k) - \sum_{i=1}^{m} w_i \cdot x_i(k)$$

$$\frac{\partial e(k)}{\partial w_i} = -x_i(k) \quad \text{EQ 3}$$

$$\frac{\partial E[\{e(k)\}^2]}{\partial w_i} = E\left[2e(k) \cdot \frac{\partial e(k)}{\partial w_i}\right] \quad \text{EQ 4}$$
$$= -2E[e(k) \cdot x_i(k)]$$

$$w_i^{(c+1)} = w_i^{(c)} + 2\mu E[e(k) \cdot x_i(k)] \quad \text{EQ 5}$$
$$\approx w_i^{(c)} + \mu_{LMS} \cdot e(k) \cdot x_i(k)$$

A drawback of the LMS algorithm is that it has to monitor the inputs of the linear combiner. If the data rate is very high, monitoring a high-speed signal will cause overhead issues, such as maximum operational speed and power consumption drawbacks. Another problem of the LMS algorithm is that, even if the steady state is different from the real best state [for example, in the context of other performance metrics such as data error rate], it is not possible to adjust the steady state to the real best state.

Figure 4:
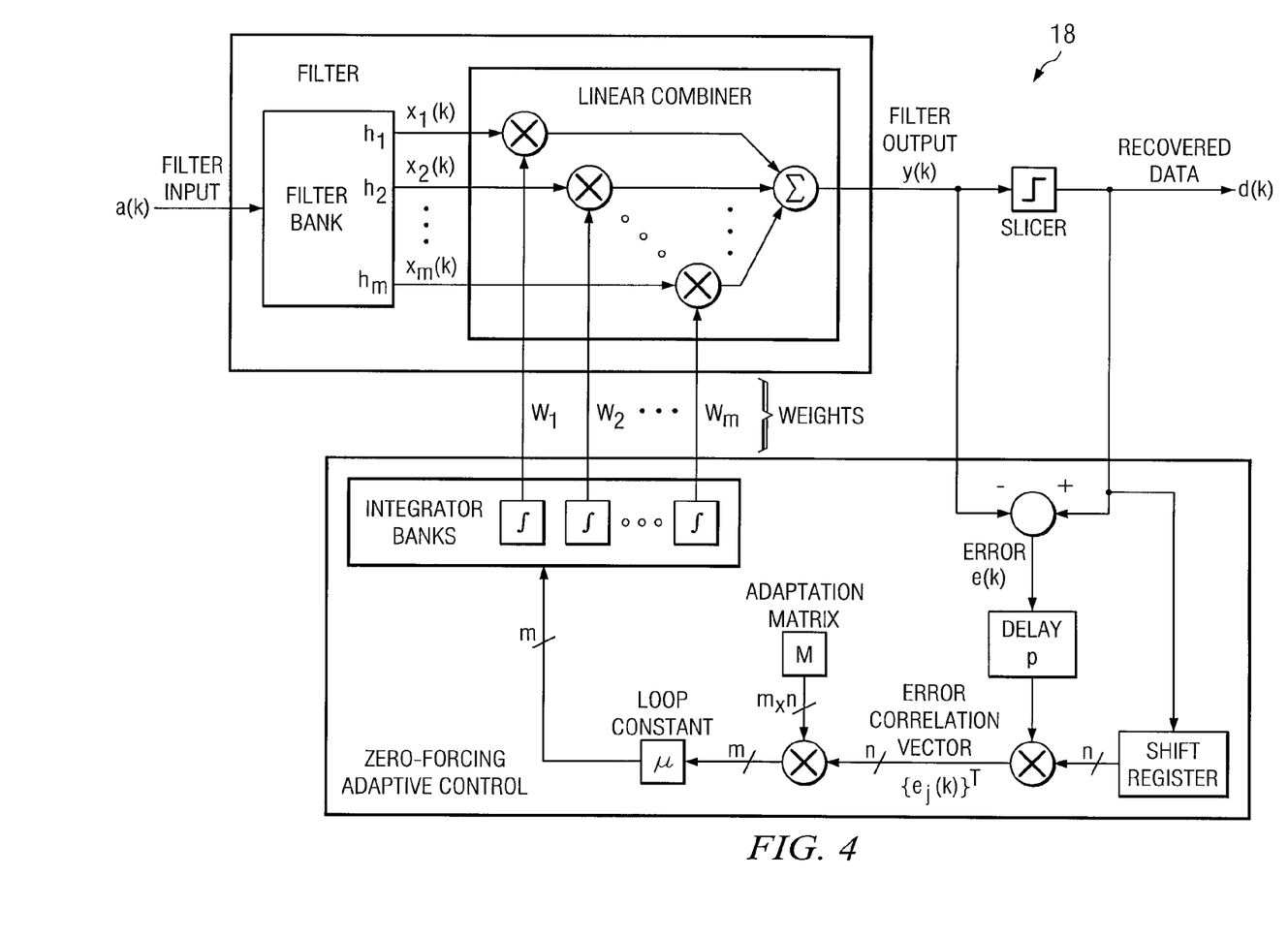
FIG. 4 is a simplified block diagram illustrating an adaptive filter using a Zero-Forcing (ZF) algorithm.

FIG. 4 is a simplified block diagram illustrating an adaptive filter 18 using a Zero-Forcing (ZF) algorithm. The Zero-Forcing (ZF) algorithm is another adaptation algorithm model. Since it does not monitor the inputs of the linear combiner, it does not have the drawback of the LMS algorithm. There are two types of ZF algorithms. The first is the classic ZF algorithm, which uses an FIR filter and an identity adaptation matrix. The second is the general ZF algorithm, which uses a general form of adaptation matrix based on the impulse responses of each tap of the filter banks with the worst-case channel.

Classic ZF Algorithm:

$$e_j(k) = e(k-p) \cdot d(k-j+1) \quad \text{EQ 6}$$

$$w_i^{(c+1)} = w_i^{(c)} + \mu_{CZF} \cdot e_i(k) = w_i^{(c)} + \mu_{CZF} \cdot e(k-p) \cdot d(k-i+1) \quad \text{EQ 7}$$

A problem of the classic ZF algorithm is that its application is limited to an FIR filter. Another problem of the classic ZF algorithm is that it ignores errors outside of the span of the FIR filter, which makes the steady state different from the steepest descent method, and hence, it may cause failure of convergence.

These problems of the classic ZF algorithm are solved in the general ZF algorithm because it can be applied to any filter architecture (including analog continuous-time filter applications) and the difference of the steady state from the steepest descent method is negligible for the worst-case channel if the error correlation vector is sufficiently long enough.

The General ZF algorithm may be defined as follows:

$$x_i(k) = \sum_{s=-\infty}^{+\infty} h_i(s) \cdot d(k-s) \approx \sum_{s=-p}^{n-p-1} h_i(s) \cdot d(k-s) \quad \text{EQ 8}$$

$$M = \begin{pmatrix} h_1(-p) & h_1(1-p) & \cdots & h_1(n-p-1) \\ h_2(-p) & h_2(1-p) & \cdots & h_2(n-p-1) \\ \vdots & \vdots & \ddots & \vdots \\ h_m(-p) & h_m(1-p) & \cdots & h_m(n-p-1) \end{pmatrix} \quad \text{EQ 9}$$

$$e_j(k) = e(k-p) \cdot d(k-j+1) \quad \text{EQ 10}$$

$$w^{(c+1)} = w^{(c)} + \mu_{GZF} M\{e_j(k)\}^T \quad \text{EQ 11}$$

$$w_i^{(c+1)} = w_i^{(c)} + \mu_{GZF} \sum_{j=1}^{n} h_i(-p+j-1) \cdot e_j(k) \quad \text{EQ 12}$$
$$= w_i^{(c)} + \mu_{GZF} \sum_{j=1}^{n} h_i(-p+j-1) \cdot e(k-p) \cdot d(k-j+1)$$
$$= w_i^{(c)} + \mu_{GZF} e(k-p) \sum_{s=-p}^{n-p-1} h_i(s) \cdot d(k-p-s)$$
$$\approx w_i^{(c)} + \mu_{GZF} e(k-p) \sum_{s=-\infty}^{\infty} h_i(s) \cdot d(k-p-s)$$
$$= w_i^{(c)} + \mu_{GZF} e(k-p) \cdot x_i(k-p)$$
$$= w_i^{(c)} + \mu_{GZF} e(k) \cdot x_i(k)$$

A problem of the general ZF algorithm is the difficulty in creating the adaptation matrix because it is based on the impulse response of each tap of the filter banks with the worst-case channel. Measurement of impulse responses in a real system is difficult (especially in a highly integrated system) because it must be measured with a pulse or step signal, which is quite different from regular signals for data transmission. Furthermore, simulation may be inaccurate because of the limited accuracy of the simulation model.

Another problem of the general ZF algorithm is that it cannot take account of the limited linearity of the analog circuit. If the adaptation matrix is inadequate, the steady state will be different from the steepest descent method. However, there is no easy way to adjust or correct the adaptation matrix so that it converges to the best state.

In addition, although this is not critical, a limitation of the general ZF algorithm is that the steady state is same as the steepest descent method only for the worst-case channel for which the adaptation matrix has been created. If the channel is different from the worst-case channel, the steady state will be different from the steepest descent method.

Figure 5:
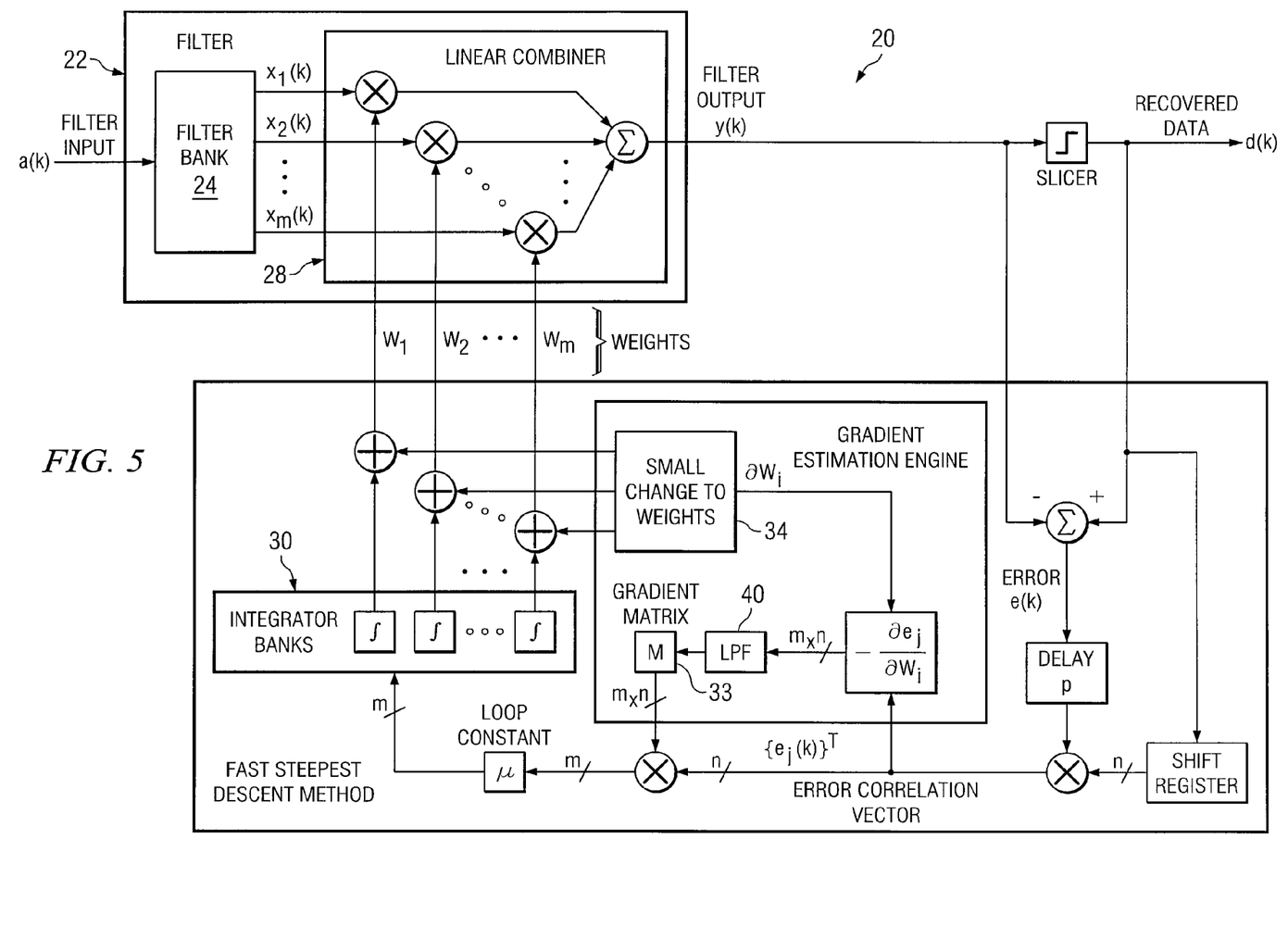
FIG. 5 is a simplified block diagram illustrating an adaptive filter using a Fast Steepest Descent method.

FIG. 5 is a simplified block diagram illustrating an adaptive filter 20 using a Fast Steepest Descent method. The Fast Steepest Descent method shown in FIG. 5 is an efficient implementation of the steepest descent method without monitoring the inputs of the linear combiner. FIG. 5 includes a filter 22, a filter bank 24, a linear combiner 28, a set of integrator banks 30, a small change to weights component 34, a gradient matrix 33, and a low-pass filter 40.

In FIG. 5, the low-pass filter is significant, as it distinguishes FIGURES from FIG. 2. The low-pass filter is applied to the gradient estimation engine. The input to the low-pass filter is a Jacobian Matrix. The gradient value is fairly constant over the optimization. If there is a small change in weight, the error correlation vector is relatively constant. The gradient value will not change as much as the error correlation vector. The low-pass filter value is only applied for the gradient portion to maintain this consistency.

In operation, the error signal e(k) is decomposed to the error correlation vector $\{e_j(k)\}^T$ in the same way as the Zero-Forcing algorithm. The gradient estimation engine injects small changes to the weight parameters for the linear combiner, measures corresponding changes in the error correlation vector, and calculates the gradients. The gradients are processed by the low-pass-filter (LPF) in order to remove measurement noise and improve the accuracy. The LPF may be replaced with a Kalman Filter for fast convergence with ideal accuracy. The LPF output is the gradient matrix. The error correlation vector is multiplied with the gradient matrix and loop constant, and then, integrated to generate the weight parameters of the linear combiner.

The Fast Steepest Descent method is similar to the general ZF algorithm except that the constant adaptation matrix is replaced with the gradient matrix that is measured online. If the system is linear, and the channel and filter have constant characteristics, the gradient matrix should be constant and the same as the adaptation matrix for the general ZF algorithm. This is the reason why a slow time constant can be used in the gradient estimation to improve the accuracy without sacrificing the convergence speed.

Alternatively, since the real gradient of the error correlation vector is always monitored, it can also adapt to some non-linearity, and to non-constant characteristics of the channel and filter. Therefore, it is as powerful as the conventional steepest descent method.

The Fast Steepest Descent method can be defined as follows:

$$e_j(k) = e(k-p) \cdot d(k-j+1) \quad \text{EQ 13}$$

$$E[\{e(k)\}^2] \approx \frac{1}{n}\sum_{j=1}^{n} E[\{e_j(k)\}^2] \quad \text{EQ 14}$$

$$\frac{\partial E[\{e(k)\}^2]}{\partial w_i} \approx \frac{1}{n}\sum_{j=1}^{n} E\left[\frac{\partial \{e_j(k)\}^2}{\partial w_i}\right] \quad \text{EQ 15}$$

$$= \frac{1}{n}\sum_{j=1}^{n} E\left[2e_j(k) \cdot \frac{\partial e_j(k)}{\partial w_i}\right]$$

$$M = E\left[\begin{pmatrix} -\frac{\partial e_1}{\partial w_1} & -\frac{\partial e_2}{\partial w_1} & \cdots & -\frac{\partial e_n}{\partial w_1} \\ -\frac{\partial e_1}{\partial w_2} & -\frac{\partial e_2}{\partial w_2} & \cdots & -\frac{\partial e_n}{\partial w_2} \\ \vdots & \vdots & \ddots & \vdots \\ -\frac{\partial e_1}{\partial w_m} & -\frac{\partial e_2}{\partial w_m} & \cdots & -\frac{\partial e_n}{\partial w_m} \end{pmatrix}\right] \quad \text{EQ 16}$$

$$w^{(c+1)} = w^{(c)} + \mu_{FSD} M\{e_j(k)\}^T \quad \text{EQ 17}$$

$$w_i^{(c+1)} = w_i^{(c)} + \mu_{FSD} \sum_{j=1}^{n} E\left[-\frac{\partial e_j(k)}{\partial w_i}\right] \cdot e_j(k) \quad \text{EQ 18}$$

$$= w_i^{(c)} - \frac{\mu_{FSD}}{2}\sum_{j=1}^{n} E\left[2e_j(k) \cdot \frac{\partial e_j(k)}{\partial w_i}\right]$$

$$\approx w_i^{(c)} - \frac{\mu_{FSD} \cdot n}{2} E\left[\frac{\partial \{e(k)\}^2}{\partial w_i}\right]$$

The components illustrated in FIG. 5 (or in many of the illustrated architectures outlined herein) may be implemented as digital circuits, analog circuits, or any suitable combination of these elements. Alternatively, such operations and techniques may be achieved by any suitable hardware, component, device, application specific integrated circuit (ASIC), field programmable gate array (FPGA), processor, erasable programmable ROM (EPROM), electrically erasable programmable ROM (EEPROM), or any other suitable object that is operable to facilitate such operations. Considerable flexibility is provided by the structure of these architectures in the context of this arrangement. Thus, it can be easily appreciated that such functions could be provided external to the recited environment. In such cases, such a functionality could be readily embodied in a separate component, device, or module.

Figure 6:
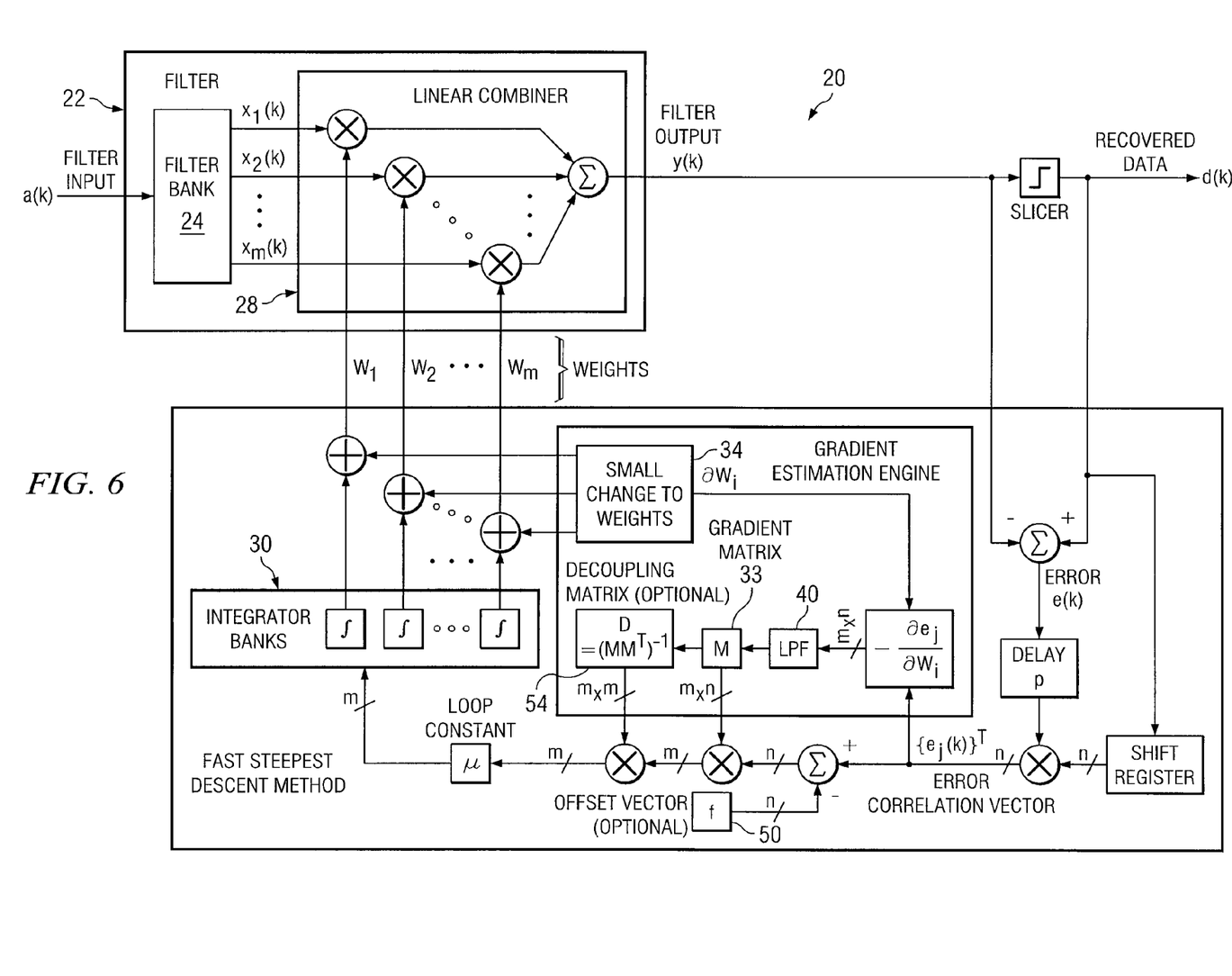
FIG. 6 is a simplified block diagram illustrating an adaptive filter using a Fast Steepest Descent method with an Offset Vector and a Decoupling Matrix, which are optional.

FIG. 6 is a simplified block diagram illustrating adaptive filter 20 using a Fast Steepest Descent method with an Offset Vector 50 and a Decoupling Matrix 54: both of which are optional. The offset vector may be optionally subtracted from the error correlation vector. This can be used to adjust the steady state to the real best state in conjunction with other performance metrics such as data error rate. For instance, the value of the error correlation vector characterized at the real best state can be used as the value of the offset vector. The decoupling matrix may be optionally used to decouple multiple control loops, which makes the convergence faster. However, it may require heavy computation because of calculation of an inverse matrix.

Note that the formulas used for the Fast Steepest Descent Method are basically the same as the damped Gauss-Newton Method. The difference between them is that the Fast Steepest Descent Method applies a low-pass filter for the estimated gradient value, whereas the general damped Gauss-Newton Method uses the measured gradient directly. Namely, in the damped Gauss-Newton Method, the gradient value (or the Jacobian matrix) is measured and used independently for each iteration. Therefore, the measurement noise enhanced by a gradient calculation directly affects the feedback control loop and reduces the accuracy of the control. On the other hand, in this invention, the gradient value (or the Jacobian matrix) is averaged over several iterations using a low-pass filter. An advantage of using the low-pass filter is improved accuracy by removing noise in the gradient measurement.

While the accuracy in the damped Gauss-Newton Method may be improved by lowering the loop constant, it makes the control loop slower, and it takes longer convergence time. In the present invention of the Fast Steepest Descent Method, accuracy can be improved without sacrificing the control speed. The following is an example of the improvement of the accuracy over the damped Gauss-Newton Method using the present invention of the Fast Steepest Descent Method.

Suppose the expected value $E[e_j]$ is 100, $E[e_j]$ changes by +1 in response to a small positive change in $w_i$, and measured $e_j$ varies randomly about up to ±3 due to measurement noise. Then, the change of $E[e_j]$ in response to a small change in $w_i$ will be buried in the measurement noise, and the (negative) gradient value $$-\frac{\partial e_j}{\partial w_i}$$

will vary from −4 to +2 (i.e. −1±3).

In the dumped Gauss-Newton method, since it is directly used, the feedback value $$-\frac{\partial e_j}{\partial w_i} \cdot e_j$$

will vary from −400 to +200 (i.e. −100±300). This may happen in the equilibrium state, because while the sum of feedback value $$\sum_{j=1}^{n} -\frac{\partial e_j}{\partial w_i} \cdot e_j$$

is statistically zero in the equilibrium state, each value of $$-\frac{\partial e_j}{\partial w_i} \cdot e_j$$

may not be statistically zero. (It is statistically −100 in this example.) If the measurement noise may be independent for each j, this noise will vary the equalizer parameter $w_i$ by ±300μ, where μ is the loop constant of the feedback control.

In the present invention of Fast Steepest Descent Method, a low-pass filter is applied to reduce noise in $$-\frac{\partial e_j}{\partial w_i}.$$

FIG. 9 is a simplified block diagram illustrating an example of a first-order low-pass filter 60 in accordance with an embodiment of the present invention. The low-pass filter is flanked at each end by Standard Deviation metrics. In this example, the standard deviation of σ, is reduced to $$\sqrt{\frac{\lambda}{2-\lambda}} \sigma.$$

Here, λ is a parameter in the low-pass filter, and takes a positive smaller than 1. For instance, if λ is 0.01, the measurement noise is reduced by a factor of $$\sqrt{\frac{0.01}{2-0.01}} \approx 0.07.$$

If this low-pass filter is applied in the above example, the (negative) gradient value $$-\frac{\partial e_j}{\partial w_i}$$

with reduced noise will be −1±3×0.07=−1±0.21, and the feedback value $$-\frac{\partial e_j}{\partial w_i} \cdot e_j$$

will be −100±21. Therefore, the variation of the equalizer parameter $w_i$ due to this measurement noise is reduced down to ±21μ.

In terms of advantages in the previously disclosed arrangements and configurations, the Fast Steepest Descent Method offers improved accuracy and speed. In addition, such an architecture is easy to adjust the steady state to the real best state and, further, easy to decouple interactions between multiple control loops.

In regards to the Least-Mean-Square algorithm, there is no need to observe the inputs of the linear combiner and, further, the system takes into account some non-linearity of the system. In addition, the configuration is easy to adjust the steady state to the real best state, while being easy to decouple interactions between multiple control loops.

Also, in the context of a general ZF algorithm, the system is always the same steady state as the steepest descent method. Moreover, such a framework takes into account some non-linearity of the system. In addition, this system keeps tracks of the change in the channel and filter characteristics. In such an arrangement, there is no need to use the impulse response of the worst-case channel with filter banks. Turning to the damped Gauss-Newton method, such an implementation is more accurate after convergence.

Although the present invention has been described in detail, various changes and modifications may be suggested to one skilled in the art. It is intended that the present invention encompass such changes and modifications as falling within the scope of the appended claims.

Note also that, with respect to specific process flows, steps discussed within the flows may be modified, added, or omitted without departing from the scope of the invention. Additionally, steps may be performed in any suitable order, or concurrently, without departing from the scope of the invention.

What is claimed is:

1. A method, comprising:
   providing a low pass filter in an adaptive filter architecture employing a fastest steepest descent method, the adaptive filter architecture comprising a fast steepest descent engine and a filter that includes a filter bank and a linear combiner, wherein the filter receives a filter input that is communicated through the filter bank and the linear combiner and that is output from the filter as a filter output;
   receiving an error signal at the fast steepest descent engine that is based on the filter output signal;

decomposing the error signal to an error correlation vector using the fast steepest descent engine;

using the fast steepest descent engine, injecting a small change to one or more weight parameters for the linear combiner;

using the fast steepest descent engine, measuring changes in the error correlation vector;

using the fast steepest descent engine, calculating one or more gradients, wherein the gradients are processed by the low-pass filter; and modifying the one or more weight parameters for the linear combiner based on the gradients.

2. The method of claim 1, wherein one or more of the gradients are processed by the low-pass-filter in order to remove measurement noise and improve accuracy.

3. The method of claim 1, wherein a real gradient of the error correlation vector is monitored such that adaptations can be made due to non-linearity and non-constant characteristics of a channel.

4. The method of claim 1, wherein the fast steepest descent method includes a loop constant, an error correlation vector, and a plurality of integrator banks.

5. The method of claim 1, wherein the low-pass filter output is a gradient matrix.

6. The method of claim 5, wherein the error correlation vector is multiplied with the gradient matrix and loop constant, and then, integrated to generate a plurality of weight parameters for a linear combiner.

7. The method of claim 1, wherein fast steepest descent method includes a gradient estimation engine, which further comprises a gradient matrix.

8. The method of claim 1, wherein the adaptive filter includes an offset vector and a decoupling matrix.

9. A system comprising:
a low pass filter;
a fastest steepest descent engine; and
a filter that includes a filter bank and a linear combiner;

wherein the filter is configured to receive a filter input that is communicated through the filter bank and the linear combiner and that is output from the filter as a filter output;

wherein the fast steepest descent engine is configured to:
receive an error signal that is based on the filter output signal;
decompose the error signal to an error correlation vector;
inject a small change to one or more weight parameters for the linear combiner:
measure changes in the error correlation vector;
calculate one or more gradients, wherein the gradients are processed by the low-pass filter; and
modify the one or more weight parameters for the linear combiner based on the gradients.

10. The system of claim 9, wherein one or more of the gradients are processed by the low-pass-filter in order to remove measurement noise and improve accuracy.

11. The system of claim 9, wherein a real gradient of the error correlation vector is monitored such that adaptations can be made due to non-linearity and non-constant characteristics of a channel.

12. The system of claim 9, wherein the fast steepest descent method includes a loop constant, an error correlation vector, and a plurality of integrator banks.

13. The system of claim 9, wherein the low-pass filter output is a gradient matrix.

14. The system of claim 13, wherein the error correlation vector is multiplied with the gradient matrix and loop constant, and then, integrated to generate a plurality of weight parameters for a linear combiner.

15. The system of claim 9, wherein fast steepest descent method includes a gradient estimation engine, which further comprises a gradient matrix.

16. The system of claim 9, wherein the adaptive filter includes an offset vector and a decoupling matrix.

* * * * *